(12) United States Patent
Gastaldi et al.

(10) Patent No.: US 6,532,171 B2
(45) Date of Patent: Mar. 11, 2003

(54) NONVOLATILE SEMICONDUCTOR MEMORY CAPABLE OF SELECTIVELY ERASING A PLURALITY OF ELEMENTAL MEMORY UNITS

(75) Inventors: Roberto Gastaldi, Agrate Brianza (IT); Paolo Cappelletti, Seveso (IT); Giulio Casagrande, Vignate (IT); Giovanni Campardo, Bergamo (IT); Rino Micheloni, Turate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/919,789

(22) Filed: Jul. 31, 2001

(65) Prior Publication Data

US 2002/0041534 A1 Apr. 11, 2002

(30) Foreign Application Priority Data

Aug. 2, 2000 (EP) .............................. 00830553

(51) Int. Cl.$^7$ .............................. G11C 16/16
(52) U.S. Cl. .............................. 365/185.12; 365/185.13; 365/185.11; 365/185.33; 365/185.29; 365/185.02
(58) Field of Search .................. 365/185.11, 185.12, 365/185.13, 185.18, 185.33, 182.29, 185.02

(56) References Cited

U.S. PATENT DOCUMENTS

| 5,502,669 | A |   | 3/1996  | Saitoh .............. | 365/185.27 |
| 5,777,924 | A |   | 7/1998  | Lee et al. .......... | 365/185.11 |
| 5,831,915 | A | * | 11/1998 | Pascucci ............ | 365/200    |
| 5,994,732 | A |   | 11/1999 | Ajika et al. ........ | 257/315    |
| 6,031,764 | A |   | 2/2000  | Imamiya et al. ..... | 365/185.29 |

FOREIGN PATENT DOCUMENTS

| EP | 059080 A2 | 4/1994 | ......... G06F/11/16 |
| WO | WO9828748 | 7/1998 | ......... G11C/11/401 |

OTHER PUBLICATIONS

Shigeru Atsumi et al., "A 16–Mb Flash EEPROM with a New Self–Data–Refresh Scheme for a Sector Erase Operation," *IEICE Transactions on Electronics*, vol. E77–C(No. 5):791–798, May 1994.

* cited by examiner

*Primary Examiner*—Andrew Q. Tran
(74) *Attorney, Agent, or Firm*—Lisa K. Jorgenson; David V. Carlson; SEED IP Law Group PLLC (57) ABSTRACT

A semiconductor memory such as a flash memory, which comprises at least one two-dimensional array of memory cells with a plurality of rows and columns of memory cells grouped in a plurality of packets. The memory cells belonging to the columns of each packet are formed in a respective semiconductor region with a first type of conductivity, this region being distinct from the semiconductor regions with the first type of conductivity in which the memory cells belonging to the columns of the remaining packets are formed. The semiconductor regions with the first type of conductivity divide the set of memory cells belonging to each row into a plurality of subsets of memory cells that constitute elemental memory units which can be modified individually. Thus memory units of very small dimensions can be erased individually, without excessive overhead in terms of area.

14 Claims, 8 Drawing Sheets

NONVOLATILE SEMICONDUCTOR MEMORY CAPABLE OF SELECTIVELY ERASING A PLURALITY OF ELEMENTAL MEMORY UNITS

TECHNICAL FIELD

The present invention relates to the field of semiconductor memories, particularly to non-volatile memories, and even more particularly to memories in which operations to modify the content thereof, either by writing or by erasure, are performed electrically. In particular, the present invention relates to flash memories.

BACKGROUND OF THE INVENTION

Flash memories are being used and will be used to an ever greater extent in various applications. This is due to a large degree to the fact that these memories can be written and erased electrically, to the availability of technological processes which enable high-capacity flash memories to be produced, and to the low cost of these memories.

Some of these applications involve the ability to modify data at the level of octets (bytes, eight bits), of words (sixteen bits) or of extended words (long words, thirty-two or sixty-four bits).

In current flash memories, particularly in flash memories with so-called NOR architecture, which are the most widespread at the moment, the matrix (array) of memory cells or memory matrix is normally divided into a certain number of sectors each of which contains a particular number of physical rows (word lines) or of physical columns (bit lines). The dimensions of the sectors may vary considerably; however, the smallest sector dimension which can be achieved in practice at reasonable cost by the conventional technique for dividing the matrix amounts to a few kbytes. A typical division of the memory matrix of a flash memory provides, for example, identical sectors each of 64 kbytes which are intended, in use, to store substantially invariable portions of micro-code, with a few smaller sectors, for example of from 2 to 4 kbytes, which can advantageously be used for storing parameters which are to vary with some frequency.

In a typical flash-memory architecture, all of the memory cells which make up a given sector are formed in a respective semiconductor well with p-type conductivity which in turn is formed in a respective semiconductor well with n-type conductivity. A typical method of performing the operation to "erase" the memory cells of a sector provides for the selection of all of the rows of the sector which are to be erased; the electric field necessary to erase the memory cells of the sector is supplied partly by biasing the rows to a negative potential and partly by biasing the semiconductor well with p-type conductivity (the bulk of the memory cells) to a positive potential. All of the memory cells of the sector are thus erased simultaneously. The sectors therefore represent the units of memory which can be erased independently of the others.

The main obstacle to the reduction of the size of the sectors in flash memories is the considerable increase in area ("overhead") in terms of the ratio between the total area and the area occupied by the memory cells of the sector. This increase in area can be quantified as about 10% for 0.5 Mbit sectors and rises to 100% for sectors with dimensions of a few kbits.

To achieve better resolution without introducing the above-mentioned considerable increase in area, it is possible to modify the architecture of the circuits for selecting the rows, rendering them capable of selecting only one row during the erasure operation instead of all of the rows. The positive potential is thus still applied to the semiconductor well with p conductivity but the negative potential necessary for the erasure is applied solely to the row selected and only the memory cells belonging to the row selected are therefore erased. With reference to the example given above, this technique enables the dimensions of a memory block, that is, of the unit which can be erased individually, to be reduced to values of the order of magnitude of one kbit, with a very small increase in area since the modifications which have to be made to the circuits for decoding and selecting the rows in order to render them capable of transferring a negative voltage solely to the row selected for erasure, instead of to all of the rows of the block, do not significantly affect the area occupied.

However, this technique has two main disadvantages. In the first place, the resolution which can thus be achieved is nevertheless still insufficient for some applications; an ability to erase individually memory blocks with dimensions of a few kbits may not be sufficient for some applications which, as mentioned, would involve the ability to modify data at byte, word, or long-word level.

A second disadvantage of the technique described lies in the fact that, during erasure, since the semiconductor well with p conductivity in which all of the cells of the sector are formed is nevertheless biased to the positive potential, the cells which are not selected are also subjected to a stress which, in the long term, may lead to destruction of the data stored therein.

SUMMARY OF THE INVENTION

According to the present invention, a semiconductor memory, particularly of the electrically programmable and erasable type, comprising at least one two-dimensional array of memory cells with a plurality of rows and a plurality of columns of memory cells, characterized in that the columns of memory cells of the at least one two-dimensional array are grouped in a plurality of packets of columns, and the memory cells belonging to the columns of each packet are formed in a respective semiconductor region with a first type of conductivity, this region being distinct from the semiconductor regions with the first type of conductivity in which the memory cells belonging to the columns of the remaining packets are formed, the semiconductor regions with the first type of conductivity being formed in a common semiconductor region with a second type of conductivity, opposite to the first type.

BRIEF DESCRIPTION OF THE DRAWINGS

The characteristics and the advantages of the present invention will become clear from the following detailed description of a possible embodiment thereof, provided purely by way of non-limiting example, with reference to the appended drawings, in which.

DETAILED DESCRIPTION OF THE INVENTION

Figure 1:
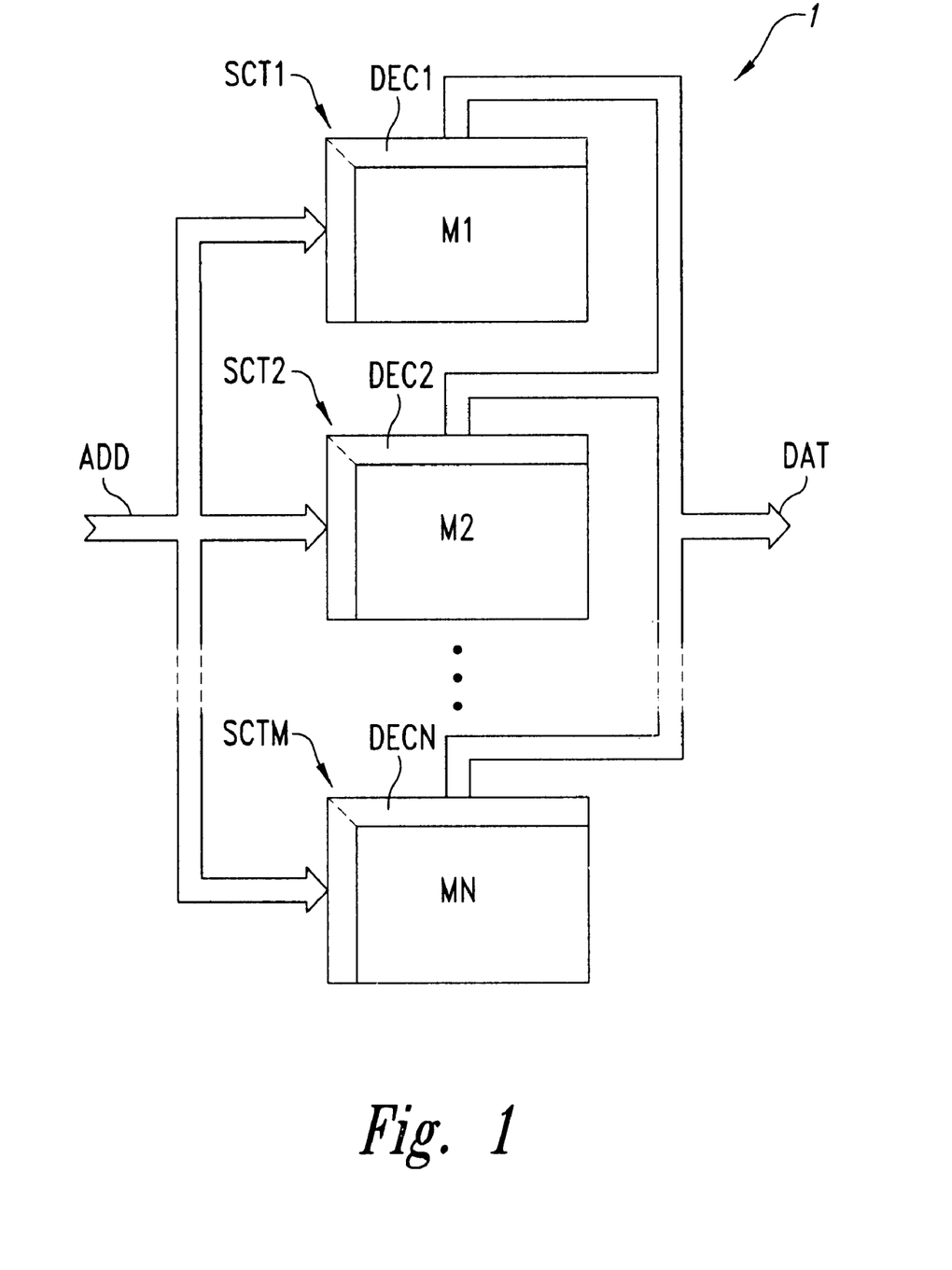
FIG. 1 is a simplified block diagram of a memory according to the present invention.

With reference to FIG. 1, a memory 1 comprises a plurality of physical sectors SCT1, SCT2, . . . , SCTM. Each sector comprises a respective plurality of memory cells arranged in rows and columns to form a two-dimensional matrix M1, M2, . . . , MN. For the selection of the rows and the columns of the respective matrix, each sector comprises circuits DEC1, DEC2, . . . , DECN, for decoding address signals ADD and for selecting rows and columns.

The sectors SCT1, SCT2, . . . , SCTM of the memory may have the same or different dimensions (in terms of the number of memory cells).

Figure 2:
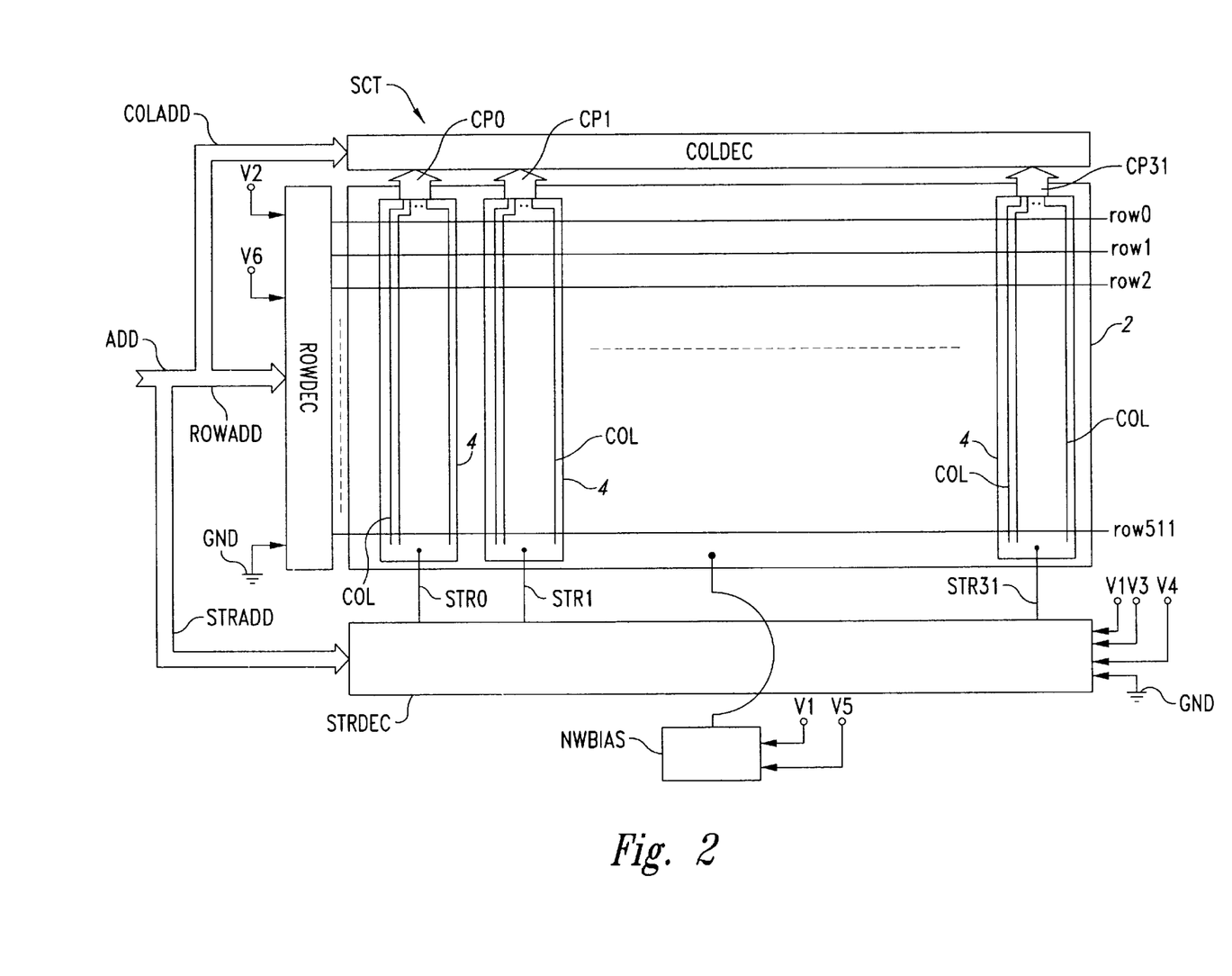
FIG. 2 is a schematic view of a sector of the memory of FIG. 1.

With reference now to FIG. 2, this shows schematically a generic sector SCT of the plurality of sectors which make up the memory. The sector SCT comprises a plurality of rows; in the embodiment shown there are 512 rows row0–row511, which can be selected by a circuit ROWDEC for decoding row address signals ROWADD. The sector SCT also comprises a plurality of columns COL; in the embodiment shown there are 1024 columns (not shown explicitly in FIG. 2 for greater clarity). The columns are grouped in packets CP0-CP31; in the embodiment shown there are thirty-two packets each of thirty-two columns. The columns can be selected by means of a circuit COLDEC for decoding column address signals COLADD.

Figure 3:
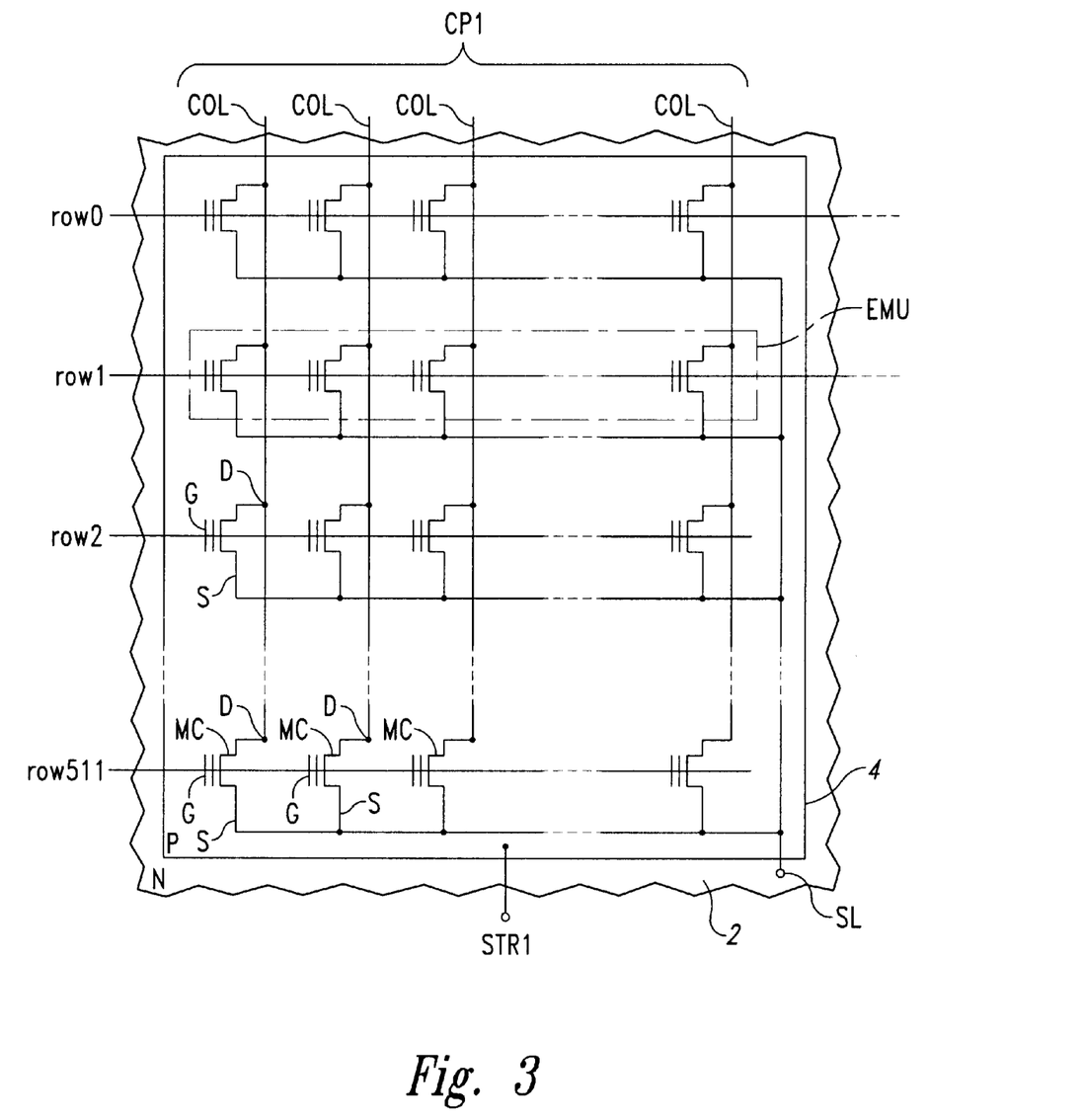
FIG. 3 is a schematic view of a portion of the sector of FIG. 2.

As shown in FIG. 3, in each packet CP0–CP31 of columns, memory cells MC, for example, constituted by floating-gate MOS transistors, have their gates G connected to respective rows of the plurality of rows row0–row511, their drains D connected to respective columns COL of the packet, and their sources S connected to a source line SL common to all of the memory cells of the columns COL of the packet.

Figure 4:
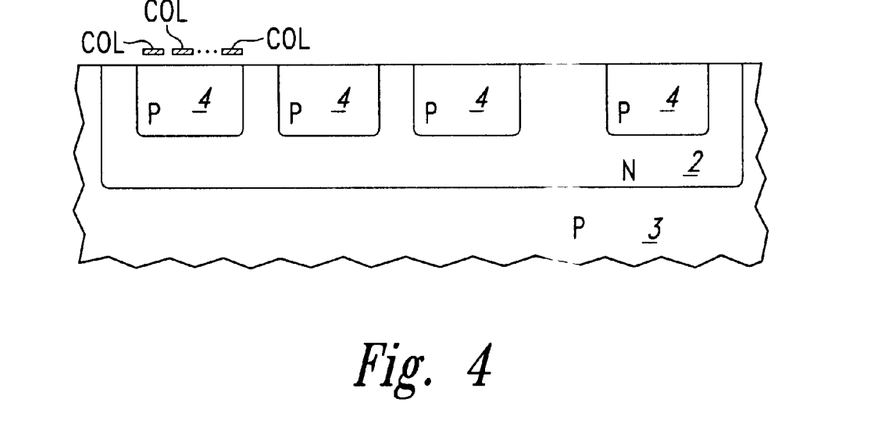
FIG. 4 is a schematic view of the sector of FIG. 2, sectioned in a plane perpendicular to the drawing, extending parallel to the rows of the memory sector.

FIGS. 2 and 4 will now be referred to together: FIG. 4 shows schematically a section through a portion of a semiconductor chip in which the memory is integrated, in particular, the portion of the chip in which the memory sector SCT is integrated. A frame 2 in FIG. 2 delimits and identifies a semiconductor well with a given type of conductivity, for example n-type conductivity, (an n-well) formed in accordance with known techniques, for example, by selective implantation and diffusion of an n-type dopant such as phosphorus, in a semiconductor substrate 3 with the opposite type of conductivity, that is, with p-type conductivity in the embodiment shown. Frames 4 in FIG. 2 identify extended regions or strips of semiconductor with the opposite type of conductivity to that of the well 2, that is, p-type strips formed in the n-type well 2, in the embodiment shown. The strips extend transversely relative to the rows, in particular in the direction of the columns, and are physically separate from one another.

All of the memory cells MC belonging to the columns of a given packet are formed in the same p-type strip 4.

FIG. 2 also shows two blocks STRDEC and NWBIAS. The block STRDEC supplies the appropriate biasing voltages, according to the mode of operation of the memory, to the p-type strips 4, by means of respective lines STR0–STR31. The control of the voltages for biasing the strips 4 is selective, in the sense that the block STRDEC can supply to a particular strip 4, by means of the respective line STR0–STR31, a biasing voltage which is different from that supplied to the remaining strips 4. The strip 4 is selected on the basis of a subset of strip address signals STRADD of the set of address signals ADD; in the embodiment described, the subset STRADD will comprise five address bits in order to be able to select one packet of the thirty-two blocks CP0–CP31.

The block NWBIAS, on the other hand, supplies the appropriate biasing voltages to the n-type well 2, in dependence on the mode of operation of the memory.

By virtue of the structure described, the elemental memory unit which can be modified individually, that is, which can be erased and written individually, is constituted by the group of memory cells MC which belong both to the same row of the 512 rows row0–row511 and to the thirty-two columns COL of the same packet of the thirty-two packets CP0–CP31 (for example, the memory unit EMU in FIG. 3). In the embodiment described, the sector SCT thus comprises 512*32 elemental memory units which can be modified individually, each elemental memory unit being constituted by a memory word of thirty-two bits (an extended memory word or "long word," or memory page). This is purely a non-limiting example, since the size of the individual elemental memory unit may vary in dependence on the particular embodiment and may, for example, be equal to eight bits (a byte), to sixteen bits (a word), to sixty-four bits, or to other sizes required by the particular application at a particular time.

Figure 5:
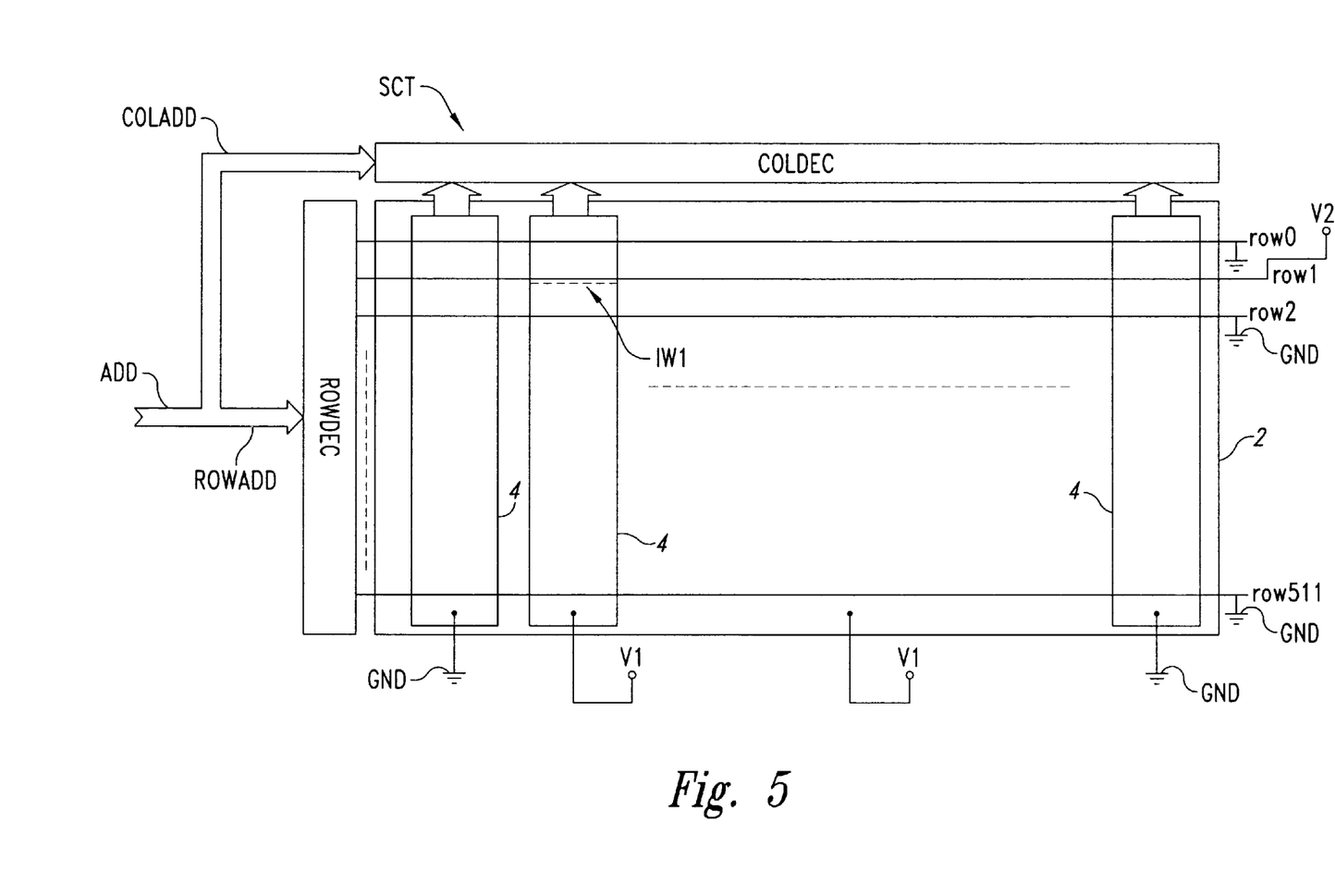
FIGS. 5 and 6 show the sector of FIG. 2 again, indicating the biasing voltages used in an erasure operation and in an operation to write a memory word, respectively.
Figure 6:
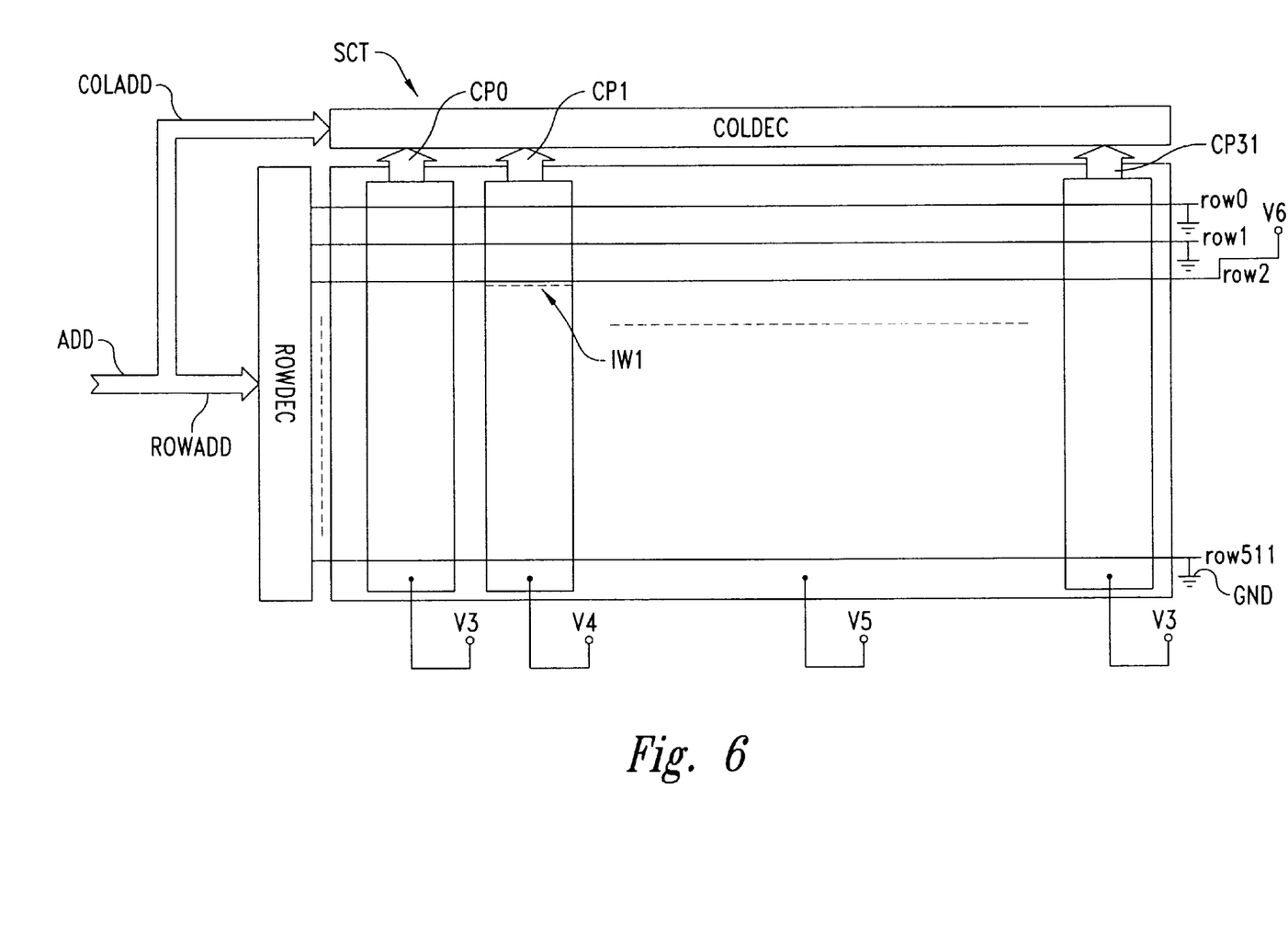

FIGS. 5 and 6 show the memory sector SCT in the schematic view of FIG. 2, during an erasure operation and during a writing operation, respectively.

Specifically, FIG. 5 relates to an operation to erase an elemental memory unit, that is, in the embodiment described, a long word 1W1 formed by thirty-two memory cells MC belonging to the row row1 and to the thirty-two columns COL of the packet CP1. The circuit ROWDEC biases the row row1 to a voltage V2, for example, a negative voltage equal to −8V. The other rows row0 and row2–row511 are biased to a voltage corresponding to the earth (0V). The circuit STRDEC biases the p-type strip 4, within which the memory cells MC belonging to the columns COL of the packet CP1 are formed, to a relatively high positive voltage V1, for example 8V. The remaining p-type strips 4 within which the memory cells belonging to the columns COL of the remaining packets CP0 and CP2–CP31 are formed, are biased to a suitably low voltage, for example, to ground (0V). The source lines SL common to the memory cells MC of each packet are kept at a potential substantially corresponding to the potential to which the respective p-type strip 4 is biased; that is, the sources S of the memory cells MC of the packet CP1 are biased to the voltage V1, and the sources S of the memory cells MC of the remaining packets are biased to ground. The circuit NWBIAS in turn biases the n-well 2 in which the p-type strips 4 are formed to a positive voltage, for example, to the voltage V1 to which the p-type strip 4 containing the cells which form the memory word 1W1 to be erased is biased. The columns COL, in particular, those of the packet CP1, and hence the drains of the memory cells MC, are left floating.

In spite of the fact that the entire row row1 is biased to the erasure voltage V2, and hence in spite of the fact that all of the memory cells MC belonging to the row row1 have the erasure voltage V2 applied to their gates, only the memory cells MC of the row row1 which belong to the columns of the packet CP1 that are formed in the p-type strip 4 which is biased to the positive voltage of about 8V are thus subject to an electric field favorable to the removal of the charges trapped in their floating gates. Only the memory cells MC which make up the long word 1W1 are therefore erased.

Figure 7:
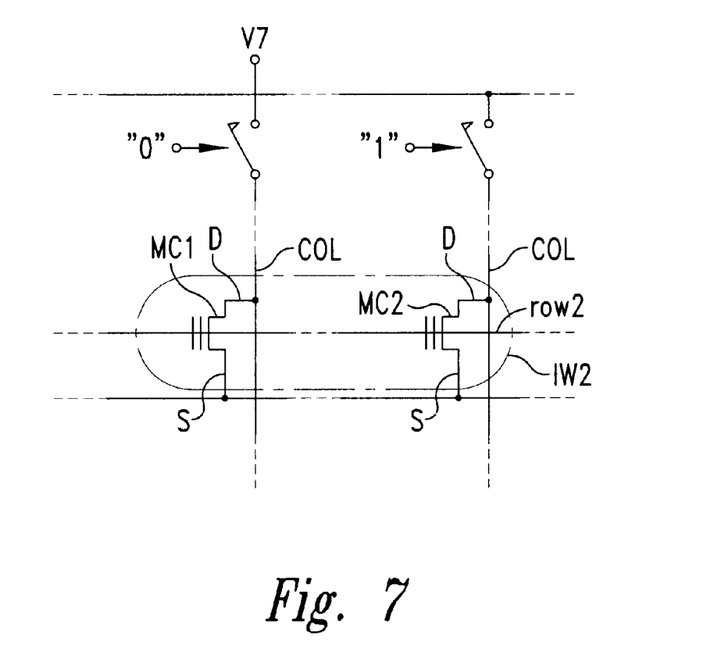
FIG. 7 is a detail of the biasing voltages applied to a pair of cells during the operation to write a memory word.

FIG. 6 and the detail thereof shown in FIG. 7, relate to an operation to write a long memory word 1w2 formed by (thirty-two) memory cells MC belonging to the row row2 and to the columns COL of the packet CP1. The circuit ROWDEC biases the row row1 to a relatively high positive voltage V6, for example of 8V or 9V; the remaining rows row0–row1 and rov3–row511 are biased to the ground voltage. The circuit STRDEC biases the p-type strip 4 within which the memory cells which make up the memory word 1w2 are formed to a voltage V4, for example, the ground voltage; alternatively, the voltage V4 may be a slightly negative voltage, for example of —1.2V; the other p-type strips 4 are biased to a voltage V3 which is equal to the ground voltage or is positive, for example, 2V. The sources of the cells formed in the p-type strip 4 selected, that is, that containing the packet CP1, are biased to ground by means of the respective source line SL. The source lines SL, and hence the sources of the memory cells MC relating to the other p-type strips 4 which are not selected, are biased to voltages substantially corresponding to the biasing voltages of the p-type strips 4 in which the cells are formed; the sources S of the memory cells MC formed in the remaining p-type strips 4 are thus biased to the voltage V3. The columns COL of the packet CP1 and hence the drains D of the memory cells MC formed in the respective p-type strip 4, are biased to a voltage which depends on the datum to be written. With reference to FIG. 7, if a memory cell MC1 of the long memory word 1w2 is to be written (so as to store a first logic level, by convention "0"), a positive voltage V7 which may adopt values between 2V and 6V, according to the technology used for the manufacture of the memory and to the situation in which the memory is used, is applied to the column COL to which the cell MC1 belongs; if a memory cell MC2 of the long memory word 1w2 is not to be written (so as to store a second logic level, conventionally "1"), the column COL to which the memory cell MC2 belongs is left floating. The columns COL, and hence the drains D, of the cells belonging to the other packets, are left floating. The circuit NWBIAS biases the n-well 2 in which the p-type strips 4 are formed to a positive voltage V5 equal to or greater than V3 (for reverse biasing of the pn junction formed by the well 2 and by the strips 4 which are biased to the voltage V3); the voltage V5 may be, for example, the supply voltage (Vdd) of the memory 1 as a whole.

Only the memory cells MC which belong to the row row2 biased to the positive programming voltage V6, which are formed in the p-type strip 4 biased to the voltage V4, and the drains of which are biased to the voltage V7, are thus subject to an electric field suitable for injecting charges into their floating gates (the injection mechanism being the known hot-electron injection or "CHE injection" effect). Only the desired cells of the long memory word 1w2 are therefore programmed. In other words, the resolution of the writing operation corresponds to a single bit.

With regard to the reading operation, all of the p-type strips 4 are biased to ground; the row selected is biased to the supply voltage (Vdd) of the memory and the rows which are not selected are biased to ground; the columns selected, that is, the drains D of the cells to be read, are biased to about 1V and all of the remaining columns are left floating.

By virtue of the architecture described, each individual row (row0–row511) of a memory sector is divided into a plurality (thirty-two in the embodiment described) of sections which can be selected independently of one another; these sections of the rows constitute elemental memory units or memory pages which can be modified individually. The number of columns of each packet CP0–CP31 determines the size of the individual memory page; in the embodiment described, the individual memory page has a size of thirty-two bits. Each memory page can be selected by decoding a strip address cared by the signals STRADD and consequently selecting one and only one p-type strip 4 of all those present, and by decoding a row address carried by the signals ROWADD and thus selecting one and only one row of all of those of the sector. The voltages necessary for programming, reading and erasure can thus be applied to the page selected and not to the other pages.

During the writing and erasure operations, the memory cells belonging to the long words which should not be involved in these operations undergo stresses. These stresses may be of two types. A first type of stress is responsible, in the long term, for the undesired erasure of some cells, that is, for the total or partial loss of the charge stored in the floating gates of the written cells. A second type of stress, on the other hand, is responsible for the opposite phenomenon, that is, for undesired writing which may occur in some cells, in the long term.

In particular, during an erasure operation, the cells which do not belong to the long memory word selected but which are formed in the same p-type strip 4 as the cells belonging to the word selected are subjected to a bulk stress because the p-type strip 4 is biased to the voltage V1 which is, for example, 8V. All of the cells which do not belong to the memory word selected but which nevertheless belong to the same line as the word selected, on the other hand, are subjected to a gate stress because the voltage V2, which is, for example, –8V, is applied to this row. During a writing operation, on the other hand, all of the cells which do not belong to the long memory word selected but which nevertheless belong to the columns to which the writing voltage V7 is applied, are subjected to a drain stress. After repeated cycles of erasure and writing of the memory, these three stresses may cause loss of charge by one or more memory cells and hence undesired erasure thereof and thus fall within the first type of stress mentioned above.

A stress of the second above-mentioned type occurs, however, during an operation to write a long memory word; all of the cells belonging to the same row to which the cells of the memory word selected belong undergo a gate stress which favors the trapping of charge in their floating gates and thus favors undesired writing of the cells.

The effects of this latter type of stress can be remedied by suitably biasing the p-type strips 4 which are not selected to the positive voltage V3, for example, of about 2V, instead of to earth.

However, to prevent the stresses of the first above-mentioned type being able to cause a loss of the data stored in the memory cells as a result of repeated writing and erasure cycles, it is preferable to provide for a refreshing procedure. This procedure may, for example, provide for a step for checking the data stored in the memory cells of each memory page to identify which cells require refreshing of the data stored therein; this check provides for the memory cells to be accessed for reading in conditions which are aggravated in comparison with normal reading conditions (a check with a margin). If the memory page currently subjected to a check with a margin does not pass the check, the data which was initially stored in the page is restored by reprogramming of the memory cells of the page which have undergone a loss or reduction of the data. A new page, the memory cells of which are formed in the same p-type strip 4 as the previous one, is then checked. After the cells of the memory pages formed in the same p-type strip 4 have been checked and reprogrammed where necessary, the memory pages which belong to the row selected and the cells of which are formed in another p-type strip 4 are checked. This procedure continues until all of the pages of the p-type strip 4 selected and all of the pages of the row selected have been checked and reprogrammed where necessary.

The frequency with which the refreshing operation is performed depends on various factors such as the characteristics of the process by which the memory was manufactured, the characteristics of the memory cells, the number of rows in a sector, etc. By way of example, the refreshing step may be performed each time the content of a long memory word or memory page has to be modified (erased or written).

Figure 8:
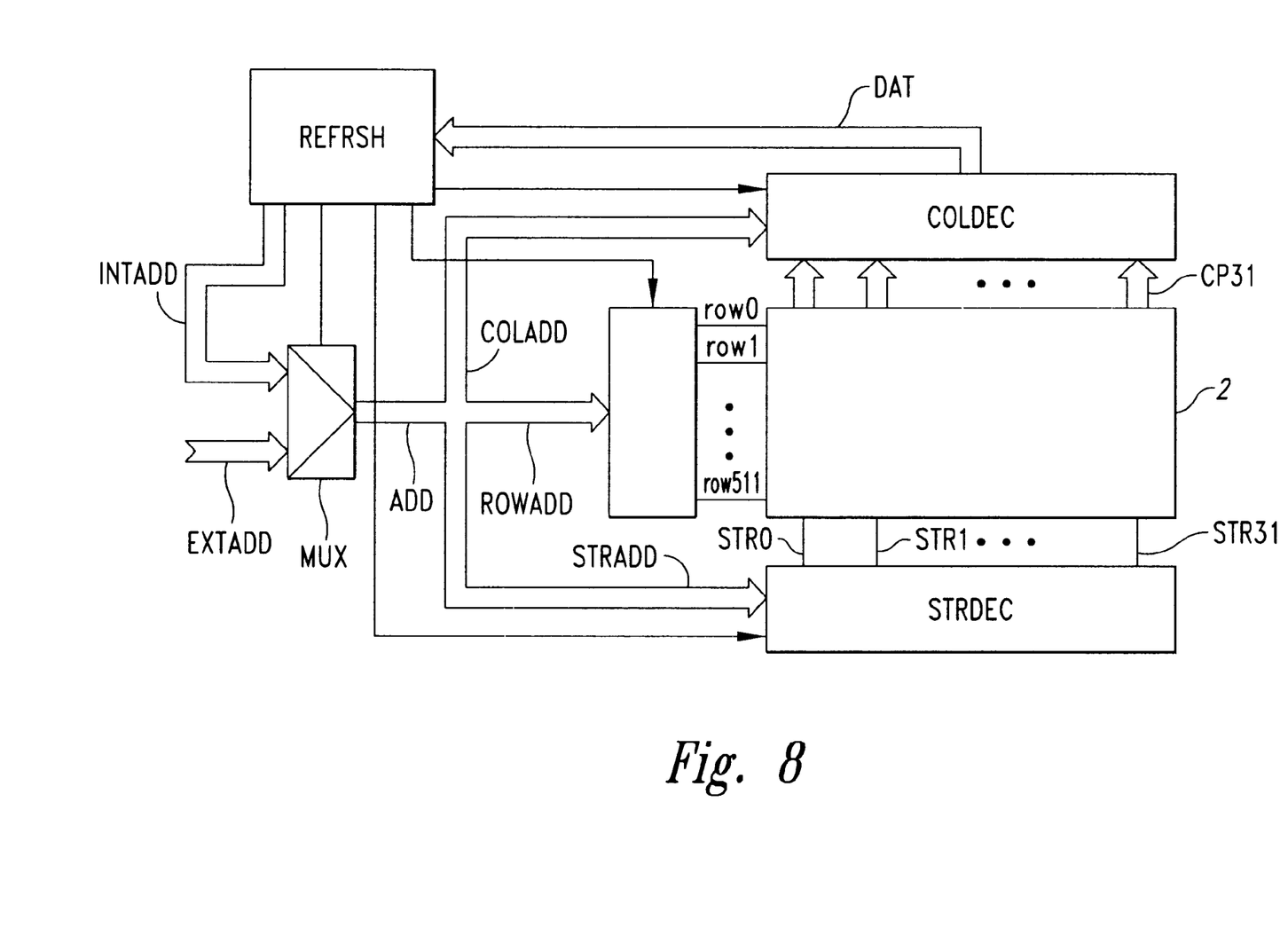
FIG. 8 is similar to FIG. 2 with the addition of a schematic representation of a circuit structure for "refreshing" the data stored in the memory cells.

FIG. 8 shows extremely schematically a possible internal circuit structure of the memory which can implement the above-described refreshing procedure. A control block REFRSH controls the various stages of a refreshing operation. For this purpose, the block REFRSH receives from the block COLDEC lines DAT carrying the result of a reading operation. The block REFRSH controls the blocks COLDEC, ROWDEC and STRDEC. The block REFRSH also controls a multiplexer MUX which can select whether to connect the address signal lines ADD to lines EXTADD outside the memory or to lines INTADD carrying address signals generated by the block REFRSH itself, in order to scan the memory pages to be checked and possibly refreshed.

Naturally, variants and/or additions may be provided for the embodiments described and illustrated above.

In particular, the memory may contain only one sector SCT instead of a plurality of sectors SCT1–SCTM; this will depend to a large extent on the overall capacity of the memory (naturally, for large-capacity memories, it will be preferable to adopt a multi-sector organization to avoid having excessively long rows and columns).

Alternatively, the memory may contain a plurality of sectors SCT1–SCTM only some of which, however, are organized in accordance with the present invention, that is, as the sector SCT described above. The other sectors could in fact have a conventional organization, and could be reserved for the storage of substantially invariable portions of micro-code.

Figure 9:
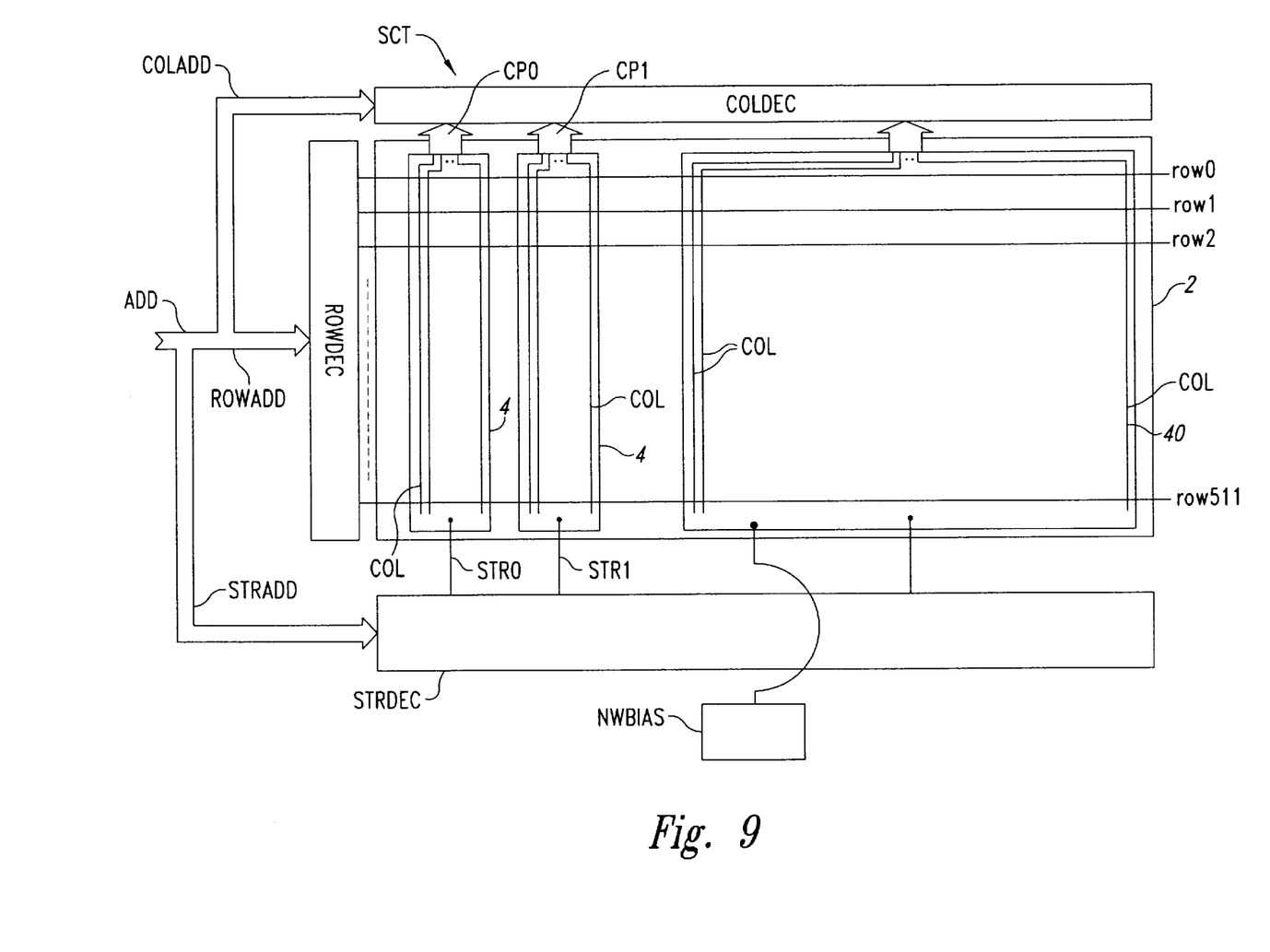
FIG. 9 shows, in a view similar to that of FIG. 2, a variant, also according to the present invention.

As a further possibility, only a portion of one of the sectors of the memory is organized in accordance with the present invention. An example of this variant is shown in FIG. 9 in which the columns are grouped in two packets CP0, CP1 (but, in general, there could be any number of packets) each containing eight, sixteen, thirty-two, or sixty-four columns, the cells of the columns of these packets CP0, CP1 being formed in respective p-type strips 4. The memory cells of the remaining columns COL of the sector, on the other hand, are formed in a common p-type region 40. In the embodiment of FIG. 9, there will therefore be 512*2 long memory words which can be erased individually, and all of the cells formed in the p-type region 40 will be erasable non-selectively.

The biasing voltages given for the embodiment described are intended purely by way of non-limiting example. The invention in fact applies irrespective of the specific values of the biasing voltages.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A semiconductor memory comprising:
   two-dimensional arrays of memory cells with a plurality of rows and a plurality of columns of memory cells;
   columns of memory cells of the two-dimensional array grouped in a plurality of packets of columns in which the memory cells belonging to the columns of each packet are formed in a respective semiconductor region with a first type of conductivity, this region being distinct from the semiconductor regions with the first type of conductivity in which the memory cells belonging to the columns of the remaining packets are formed; and
   the semiconductor regions with the first type of conductivity dividing the set of memory cells belonging to each row into a plurality of subsets of memory cells.

2. The memory according to claim 1 comprising means for selectively biasing the semiconductor regions with the first type of conductivity, the means being able to supply selectively, to the semiconductor regions with the first type of conductivity, respective biasing voltages which are variable in dependence on a mode of operation of the memory.

3. The memory according to claim 2 in which the means for selectively biasing the semiconductor regions with the first type of conductivity operate on the basis of a respective subset of a set of address signals of the memory.

4. The memory according to claim 3 comprising row selection means which can select a row in the plurality of rows during a erasure operation so as to supply an erasing voltage only to the selected row.

5. The memory according to claim 4 in which the means for selecting the rows operate on the basis of a respective subset of row address signals of the set of address signals of the memory, and further comprising means for selecting columns of the plurality of columns, the column selection means operating on the basis of a subset of column address signals of the set of address signals of the memory.

6. The memory according to claim 1 in which each of the subsets of memory cells constitutes an elemental memory unit which can be modified individually.

7. The memory according to claim 1 in which each of the semiconductor regions with the first type of conductivity is strip-shaped and has a first dimension in the direction of the rows and a second dimension in the direction of the columns.

8. The memory according to claim 7, in which the semiconductor regions with the first type of conductivity are formed in a common semiconductor region with a second type of conductivity, opposite to the first.

9. The memory according to claim 8, comprising means for biasing the semiconductor region with the second type of conductivity.

10. The memory according to claim 1, comprising means for refreshing the data stored in the memory cells, the refreshing means periodically performing conditional refreshing of the data stored in the memory cells.

11. The memory according to claim 10 in which, upon a modification of the content of a selected individually modifiable elemental memory unit, the refreshing means can perform conditional refreshing to check the data stored in the elemental memory units belonging to the same row of memory cells to which the selected elemental memory unit belongs and in the elemental memory units belonging to the same packet of columns to which the selected elemental memory unit belongs.

12. The memory according to claim 1, comprising a plurality of two-dimensional arrays of memory cells, each of which is contained in a respective region with a second type of conductivity, the regions with the second type of conductivity being formed in a common substrate with the first type of conductivity.

13. A method of refreshing the data stored in a memory, comprising:

which, upon an operation to modify the content of an elemental memory unit of the memory, provides for the following steps to be performed for each elemental memory unit belonging to the same row and to the same packet of columns to which the elemental memory unit to be modified belongs;

checking the data stored, in aggravated conditions; and reprogramming the data if the result of the check shows a loss of data.

14. A method of manufacturing a semiconductor memory which provides for the production of at least one two-dimensional array of memory cells arranged in rows and columns, comprising;

the formation of a plurality of semiconductor regions with a first type of conductivity in a common semiconductor region with a second type of conductivity, opposite to the first; and the formation, in each of the semiconductor regions with the first type of conductivity, of memory cells each belonging to a respective row of the rows and to a respective column of a packet of columns associated with the region with the first type of conductivity.

* * * * *